US012051831B2

United States Patent
Shubenkov et al.

(10) Patent No.: US 12,051,831 B2
(45) Date of Patent: Jul. 30, 2024

(54) BIPOLAR PLATE OF FUEL CELL WITH COMPOSITE CORROSION-RESISTANT GASTIGHT CONDUCTIVE COATING AND METHOD OF FORMING THEREOF

(71) Applicant: ZeroAvia, Inc., Hollister, CA (US)

(72) Inventors: Sergei Shubenkov, Moscow (RU); Aleksei Ivanenko, Moscow Region (RU); Sergei Nefedkin, Moscow (RU); Sergei Panov, Rybinsk (RU); Vladimir Sevastianov, Moscow (RU)

(73) Assignee: ZeroAvia, Inc., Hollister, CA (US)

( * ) Notice: Subject to any disclaimer, the term of this patent is extended or adjusted under 35 U.S.C. 154(b) by 235 days.

(21) Appl. No.: 17/168,926

(22) Filed: Feb. 5, 2021

(65) Prior Publication Data
US 2021/0249667 A1    Aug. 12, 2021

Related U.S. Application Data

(60) Provisional application No. 62/975,312, filed on Feb. 12, 2020.

(51) Int. Cl.
*H01M 8/0245* (2016.01)
*C23C 14/06* (2006.01)
(Continued)

(52) U.S. Cl.
CPC ....... *H01M 8/0245* (2013.01); *C23C 14/0641* (2013.01); *C23C 14/08* (2013.01);
(Continued)

(58) Field of Classification Search
CPC ............. H01M 8/0245; H01M 8/0232; H01M 8/0236; C23C 14/0641; C23C 14/08;
(Continued)

(56) References Cited

U.S. PATENT DOCUMENTS 8,623,301 B1 * 1/2014 Deininger ................ C25B 1/46
429/491
2003/0203260 A1   10/2003 Lee
(Continued)

FOREIGN PATENT DOCUMENTS

CN          104733744 B      12/2017
CN          209912963 U       1/2020
(Continued)

OTHER PUBLICATIONS

Wilberforce et al.; A Comprehensive Study of the Effect of Bipolar Plate (BP) Geometry Design on the Performance of Porton Exchange Membrane (PEM) Fuel Cells; www.elsevier.com/locate/rser; 2019; pp. 236-260.

*Primary Examiner* — James M Erwin
(74) *Attorney, Agent, or Firm* — Osha Bergman Watanabe & Burton LLP

(57) ABSTRACT

The disclosure relates to bipolar plates used in fuel cells and to methods for forming bipolar plates. A bipolar plate of a fuel cell with a composite corrosion-resistant, gastight, conductive coating comprises a core of a required shape, a first layer having high contact conductivity on the core, and a second layer having corrosion resistance, high gas-tightness, electric conductivity on the first layer and in pores of the first layer, the second layer covering at least the pores in the first layer. The first layer is preferably formed by a magnetron sputtering method, and the second layer is preferably formed by a method of thermolysis of a metalorganic compound. This ensures high gas-tightness and elasticity of a bipolar plate without compromising its corrosion resistance and contact conductivity.

27 Claims, 3 Drawing Sheets

(51) Int. Cl.
  *C23C 14/08*   (2006.01)
  *C23C 14/35*   (2006.01)
  *C23C 18/12*   (2006.01)
  *C23C 28/04*   (2006.01)
  *H01M 8/0232*  (2016.01)
  *H01M 8/0236*  (2016.01)

(52) U.S. Cl.
  CPC .......... *C23C 14/35* (2013.01); *C23C 18/1216* (2013.01); *C23C 18/1245* (2013.01); *C23C 28/042* (2013.01); *H01M 8/0232* (2013.01); *H01M 8/0236* (2013.01)

(58) Field of Classification Search
  CPC . C23C 14/35; C23C 18/1216; C23C 18/1245; C23C 28/042
  USPC ........................................................ 429/518
  See application file for complete search history.

(56) References Cited

U.S. PATENT DOCUMENTS

| | | | |
|---|---|---|---|
| 2004/0106029 A1* | 6/2004 | Iqbal | H01M 8/0204 429/535 |
| 2005/0118482 A1* | 6/2005 | Sriramulu | H01M 8/0226 429/495 |
| 2018/0254494 A1 | 9/2018 | Sivarajan | |
| 2019/0051913 A1* | 2/2019 | Dobrenizki | H01M 8/021 |

FOREIGN PATENT DOCUMENTS

| | | |
|---|---|---|
| CN | 210576224 U | 5/2020 |
| CN | 211829028 U | 10/2020 |
| CN | 211829029 U | 10/2020 |
| DE | 102016200398 A1 | 7/2017 |
| EP | 1805837 A1 | 7/2007 |

* cited by examiner

Title: BIPOLAR PLATE OF FUEL CELL WITH COMPOSITE CORROSION-RESISTANT GASTIGHT CONDUCTIVE COATING AND METHOD OF FORMING THEREOF
Inventor: SHUBENKOV et al.; Attorney Docket No. 18529-000004-US

| | Thickness, μm | | Total thickness, μm | $i_{cor}$, μA/cm² | $R_{cont}$, at 138 N/cm², Ohm·cm² |
|---|---|---|---|---|---|
| DOE Requirements: | | | | Less than 1 | Less than 0.02 |
| Specimen | 1st layer | 2nd layer | 1st and 2nd layers | | |
| 1 | 2.05 | 0 | 2.05 | 4.1 | 0.019 |
| 2 | 2.20 | 0 | 2.20 | 4.3 | 0.0195 |
| 3 | 1.03 | 0 | 1.03 | 5.1 | 0.018 |
| 4 | 0.10 | 0 | 0.11 | 10.5 | 0.016 |
| 5 | 0.2 | 0 | 0.2 | 9.8 | 0.0165 |
| 6 | 0.5 | 0 | 0.5 | 7.35 | 0.017 |
| 7 | 1.820 | 0 | 1.820 | 4.1 | 0.0185 |
| 8 | 4.030 | 0 | 4.030 | 3.8 | 0.0205 |
| 9 | 5.010 | 0 | 5.010 | 3.5 | 0.020 |
| 10 | 6.020 | 0 | 6.020 | 3.3 | 0.023 |

Fig. 2

Title: BIPOLAR PLATE OF FUEL CELL WITH COMPOSITE CORROSION-RESISTANT
GASTIGHT CONDUCTIVE COATING AND METHOD OF FORMING THEREOF
Inventor: SHUBENKOV et al.; Attorney Docket No. 18529-000004-US

| | Thickness, $\mu m$ | | Total thickness, $\mu m$ | $i_{cor}$, $\mu A/cm^2$ | $R_{cont}$, at 138 N/cm², Ohm·cm² |
|---|---|---|---|---|---|
| DOE Requirements: | | | | Less than 1 | Less than 0.02 |
| Specimen | 1st layer | 2nd layer | 1st and 2nd layers | | |
| 11 | 2.050 | 0.01 | 2.060 | 0.5 | 0.0195 |
| 12 | 2.050 | 0.03 | 2.080 | 0.12 | 0.0195 |
| 13 | 2.050 | 0.05 | 2.100 | 0.07 | 0.0195 |
| 14 | 2.050 | 0.06 | 2.110 | 0.042 | 0.020 |
| 15 | 2.050 | 0.07 | 2.120 | 0.032 | 0.021 |
| 16 | 2.050 | 0.75 | 2.125 | 0.03 | 0.029 |
| 17 | 2.050 | 0.1 | 2.150 | 0.029 | 0.025 |
| 18 | 2.050 | 3.1 | 5.150 | 0.027 | 0.31 |
| 19 | 2.050 | 5 | 7.050 | 0.023 | 0.35 |

Fig. 3

BIPOLAR PLATE OF FUEL CELL WITH COMPOSITE CORROSION-RESISTANT GASTIGHT CONDUCTIVE COATING AND METHOD OF FORMING THEREOF

CROSS-REFERENCE TO RELATED APPLICATION

This application claims the benefit of U.S. Provisional Application No. 62/975,312, filed Feb. 12, 2020. The entire disclosure of the above application is incorporated herein by reference.

FIELD

The present disclosure relates to the field of fuel cells, in particular to bipolar plates used in fuel cells, and to methods of forming bipolar plates.

BACKGROUND

This section provides background information related to the present disclosure which is not necessarily prior art.

A bipolar plate for the use in fuel cells should possess a number of properties in order to work in rather aggressive operating conditions.

As a rule, known bipolar plates are characterized by properties of providing corrosion resistance and required contact conductivity. Thus, U.S. Pat. No. 10,511,030 discloses a bipolar plate wherein an intermediate anti-corrosion nickel-tin-aluminum containing alloy layer is applied on an aluminum support, and a first anti-corrosion nickel-tin-containing alloy layer is applied over it. The presence of two corrosion-resistant layers enables to provide a bipolar plate with the corrosion-resistant property. A thickness of the intermediate layer is selected so as to prevent its peeling-off (if its thickness is too small) and prevent it from losing its electric conductivity property (if its thickness is too large).

According to Patent Application US2007231668, two layers are applied to a substrate: a conductive layer and a current collector layer. Additionally, a chemical-resistant layer may be disposed between these two layers. According to U.S. Pat. No. 5,624,769, first a protective (barrier) layer is deposited on the core, and then it is covered with a titanium-nitride layer.

The object of the above-mentioned bipolar plates and methods for forming them, as well as of many other technical solutions known in the art, is merely to ensure corrosion resistance and contact conductivity.

However, according to this disclosure, the durability of bipolar plates and their operating efficiency may be increased, if they are also characterized by high gas-tightness and elasticity. In particular, gas-tightness enables to prevent corrosion of a metal forming the bipolar plate core covered by one or more conductive and/or anti-corrosion coatings. Elasticity may ensure the integrity of a coating or coatings when a bipolar plate is subject to deformations and vibrations.

According to U.S. Pat. No. 7,150,918, in order to form a bipolar plate, a substrate is covered with two coatings: one of them being a metal-containing coating, and the other, over the first one, is a polymer-based coating. The metal containing coating may be made, but without limitation, of titanium nitride; however, it is made so as to be rather thin and have an amorphous structure; thus, this coating is smooth and uniform. The polymer-based corrosion-resistant coating serves exclusively for the protection against corrosion. To a certain degree, this bipolar plate may be considered as having certain gas-tightness (due to the amorphous structure of the metal-containing layer) and elasticity (once again, due to the amorphous structure of the metal-containing layer as well as due to the polymer-based corrosion-resistant layer). However, these additional advantages are achieved due to deterioration of the base characteristics, namely, total high corrosion resistance and high contact conductivity. To enhance conductivity, the inventors propose, according to this patent, to introduce metal particles into the polymer-based coating, which makes the process of forming a bipolar plate more complex, but does not enhance corrosion resistance. Furthermore, certain questions may arise in respect of stability of the polymer-based coating on the metal-containing coating during a long-term work of the fuel cell.

SUMMARY

This section provides a general summary of the disclosure, and is not a comprehensive disclosure of its full scope or all of its features.

According to one aspect of this disclosure, a bipolar plate and a method of forming thereof ensure high gas-tightness and elasticity of the bipolar plate, without compromising its corrosion resistance and contact conductivity which should be also at a high level.

According to another aspect of this disclosure, a method is provided for forming a fuel cell bipolar plate, wherein a conductive core of a required shape is provided, a first layer having a low surface contact resistance is formed on the core, and then a second layer having corrosion resistance and high gas-tightness is formed, at least in pores of the first layer.

Preferably, the second layer should also have medium electric conductivity in the range from 15 to 50 S/cm at a temperature in the range from 25 to 45° C.

Titanium, aluminum, or their alloys may be used as the core.

Titanium nitride may be used as the first layer that is formed, preferably, by magnetron sputtering after cleaning the core surface from dirt and an oxide film. A thickness of the first layer is in the range from 0.2 to 5 µm, more preferably—from 0.5 to 2 µm.

Preferably, the second layer should also have a medium electric conductivity in the range from 15 to 50 S/cm at a temperature in the range from 25 to 45° C. The second layer may be a ceramic coating made of electron-conducting oxides of one metal or several multicomponent complexes, like perovskites or spinels.

The second layer may be formed by a method of thermolysis of a metalorganic compound containing corresponding metals, the method comprising, in particular: depositing a metalorganic compound onto the surface of the first layer in air. Pores are filled by a metalorganic complex owing to wetting forces. During subsequent heating of a bipolar plate in air to a temperature from 300 to 600° C., thermolysis of the metalorganic complex takes place, and a gastight conductive ceramic film is formed on the surface and in the pores of the first layer. A thickness of the second layer may be controlled by changing a concentration of the metals present in the metalorganic complex.

At the same time, a thickness of the second layer on the surface of the first layer is irregular, since it depends on the first layer relief, being in the range from 10 nm to 0.1 µm, preferably from 0.03 to 0.06 µm. A thickness of the second layer in pores of the first layer is varied in the range from 0.01 µm to the thickness of the first layer.

A total contact resistance of the resulting two-layer composite coating may be controlled by changing the thicknesses of the first layer and the second layer.

According to another aspect of this disclosure, a fuel cell bipolar plate includes a core of a required shape, with the first layer disposed on the core and having a low contact resistance, and the second layer disposed on the first layer and having corrosion resistance and high gas-tightness, the second layer covering at least the pores in the first layer. Preferable materials and characteristics of the core, the first layer and the second layer correspond to those mentioned above in respect of the method for forming a bipolar plate.

Below, the disclosure and several of its possible embodiments are explained in more detail with reference to the accompanying drawings.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure

DRAWINGS

The drawings described herein are for illustrative purposes only of selected embodiments and not all possible implementations, and are not intended to limit the scope of the present disclosure.

FIG. 1 schematically shows the structure of the bipolar plate.

FIG. 2 illustrates the influence of the thickness of the protective coating on properties of the protective coating.

FIG. 3 illustrates the influence of the thickness of the second layer on properties of both protective coatings (the first layer and the second layer).

Corresponding reference numerals indicate corresponding parts or features throughout the several views of the drawings

DETAILED DESCRIPTION

Figure 1:
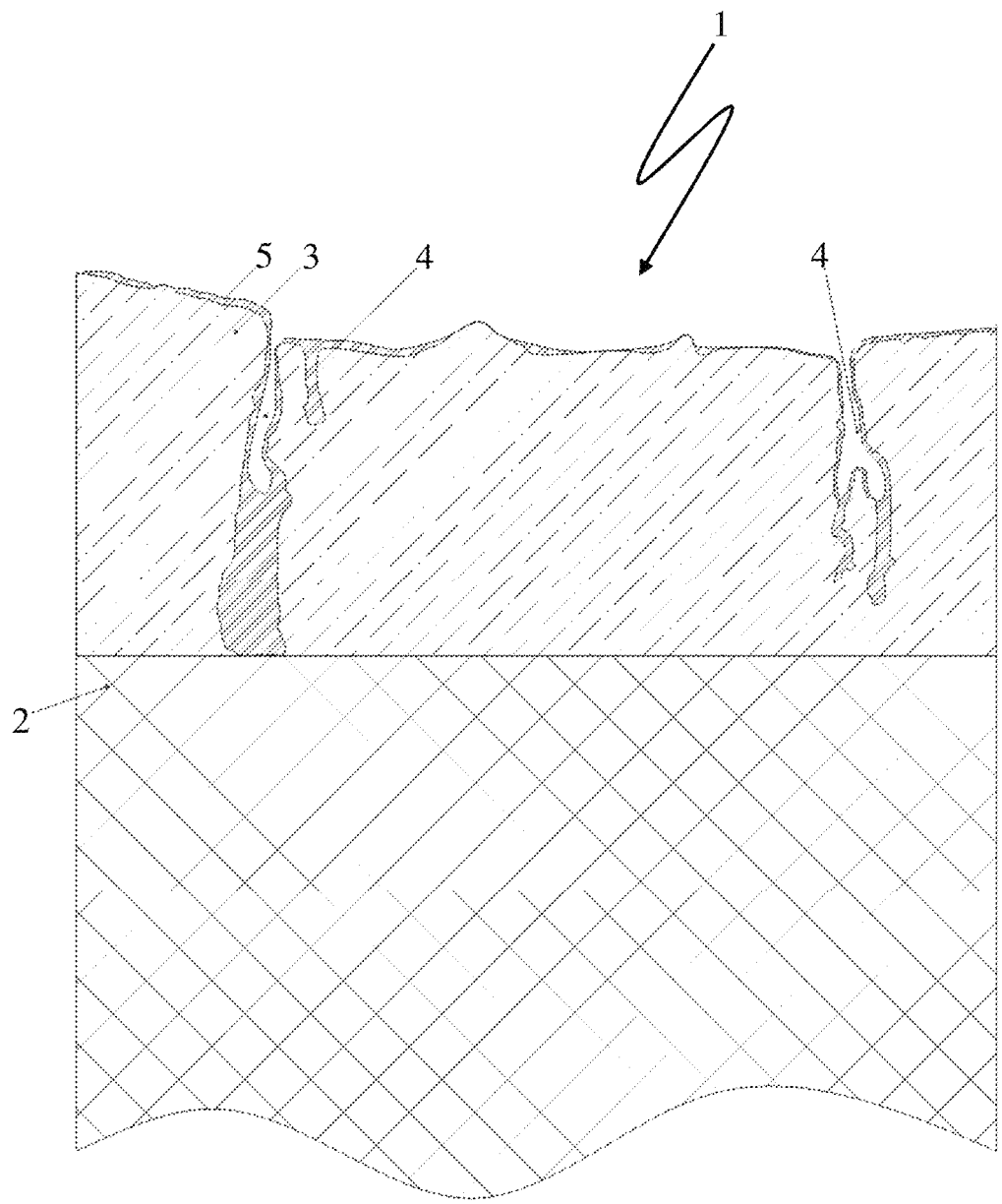

Example embodiments will now be described more fully with reference to the accompanying drawings.

In accordance with this disclosure, the fuel cell bipolar plate 1, which structure is schematically shown in the figure, should not only ensure high corrosion resistance and high contact conductivity, but also should have good gas-tightness and elasticity. As it has been already said above, gas-tightness is important for preventing corrosion of a metal contained in the core 2 of the bipolar plate 1, and elasticity ensures the integrity of the layers and the core 2 of the bipolar plate 1 in conditions of deformations and vibrations of the bipolar plate.

The core 2 may be made of an electrically conductive material of a required shape. In particular, the material of the core 2 may be titanium, aluminum, their alloys, or other conventional materials used for this purpose. Variants of the plate shape are also well known, e.g., from the above patent documents.

The core 2 is provided with the first layer 3 that should, first of all, have a low surface contact resistance. At the same time, though not obligatorily, the first layer 3 may be also characterized by good or medium (acceptable) corrosion resistance relative to that of the second layer 5 which is described below.

One of the most suitable materials for the first layer 3 is titanium nitride. To form titanium nitride with the required properties, the surface of the core 2 is cleaned by any known method (e.g., ion or plasma etching, ultrasonic cleaning, etc.), and then a titanium nitride layer is applied by the method of magnetron sputtering in vacuum. A thickness of the titanium nitride layer, with due regard to the requirements to the first layer 3, may be in the range from 0.2 to 5 µm, more preferably—from 0.5 to 2 µm.

When the first layer 3 is formed, pores 4 may appear, including those typical of titanium nitride crystalline layers produced by the magnetron sputtering method. Regardless of possible acceptable corrosion resistance of the first layer 3, the presence of pores 4 in it may result in that the first layer 3 will be susceptible to corrosion to a greater degree than expected. The mechanism of corrosion of a bipolar plate, in particular containing titanium, aluminum or their compounds, with a porous protective coating consists in penetration of corrosive agents, e.g. air oxygen, to the titanium core 2. The negative influence of this unwanted process is formation and build-up of titanium oxide layer or aluminum oxide layer under the protective coating, which leads to significant increase in bipolar plate electrical resistivity and, consequently, lowering the fuel cell characteristics.

Taking the above-said into account, the present disclosure proposes to cover the first layer 3 with a second layer 5 having, first of all, high corrosion resistance and also electronic conductivity, which is although lower than the conductivity of the first layer 3. Moreover, if the second layer 5 also has high gas-tightness, it would be sufficient to apply it to the first layer 3 in such a way that to close at least pores 4. In this case, the first layer 3 may be considered as having acceptable resistance against corrosion.

Furthermore, it is preferable that the second layer 5 is elastic in order to ensure the integrity of the first layer 3 and the second layer 5 in conditions of deformations and vibrations of the bipolar plate 1. Elasticity of the second layer 5 is provided owing to its polymer crystalline structure and its small thickness. Contact conductivity of the surface after applying the second layer 5 is reduced insignificantly, owing to conductive properties of the second layer 5 and its small thickness.

One possible embodiment of the second layer 5 is an oxide-metal ceramic coating. For example, compounds of oxides of indium, rhenium, lead, bismuth, cobalt-manganese spinel, cobalt-rhenium spinel, titanium perrhenate, lanthanum strontium cobaltite, lanthanum strontium manganite, lanthanum strontium chromite ($In_2O_3$, $Re_xO_y$, $PlO$, $Bi_2O_3$, $Co_{(1+x)}Mn_{(2-x)}O_4$, $ReCo_2O_4$, $Ti_{(1-x)}Re_xO_2$, $La_{0.6}Sr_{0.4}CoO_3$, $La_{0.7}Sr_{0.3}MnO_3$, $La_{0.7}Sr_{0.3}CrO_3$) are prospective.

In order to achieve elasticity, required corrosion resistance and conductivity, a thickness of the second layer 5 is, preferably, in the range from 0.01 to 0.1 µm, and more preferably—from 0.03 to 0.06 µm.

The second layer 5 may be formed by the method of thermolysis of a metalorganic compound containing corresponding metals in air. This enables to avoid the stage of producing powder materials as such and form regular structures of the second layer 5 from a liquid medium without using a process of melting or pressing of powders. During thermolysis, the metal dissolved in a metalorganic compound is precipitated, while simultaneously being oxidized in air and forming a polymer crystalline structure. Percentages of metals in a metalorganic compound define percentages of these metals in the resulting oxide.

The metalorganic compound in liquid form is applied by a brush, roll or blade (or other means suitable for this purpose) in air. Owing to capillary forces and high wettability, the liquid is drawn into pores 4 on the surface of the first layer 3, practically covering these pores 4. Then, the surface of the second layer 6 is heated in a common atmospheric furnace equipped with an exhaust fan to a temperature from 300 to 600° C. (the exact temperature depends on the composition of the metalorganic compound). During heating, the organic component of the metalorganic compound molecule is evaporated, and the metals contained in the metalorganic compound remain in the pores 4 and, perhaps, on the surface of the first layer 3, simultaneously turning into an electrically conductive oxide and forming in the pores 4 and, perhaps, on the surface of the first layer 3 a ceramic film of the required composition. A thickness of such a film, formed after one application, depends on selected concentrations of metals in the metalorganic compound, varying in the range from app. 0.01 to 0.1 μm. The film thickness is greater in the pores 4, and less on elevated spots on the surface of the first layer 3, and may come to naught. The process may be repeated in order to reliably close at least large pores 4. An optimal thickness is from 0.01 to 0.05 μm. This does not lead to worsening of the conductive properties of the second layer 5; and elasticity of the second layer 5 is maintained, since its thickness is small.

As a result, a composite coating is produced that has low surface contact resistance (owing to the first layer 3) and that is corrosion resistant, gastight and elastic (owing to the second layer 5), taking into account the fact that the first layer 3 and the second layer 5, individually, do not have all these necessary properties.

EXEMPLARY EMBODIMENT

In order to obtain high characteristics of specific power per unit weight (up to 2 kW/kg at the atmospheric pressure of the gases: dry hydrogen and air) for an open cathode fuel cell stack, it is necessary to use lightweight bipolar plates. In one implementation of this embodiment, a bipolar plate was used that was made as a welded member consisting of a corrugated titanium foil with the thickness of 50 μm and an anode titanium-based plate with the thickness of 100 μm welded thereto.

The fuel cells in a stack are commuted to each other by welded bipolar plates. In this case, air passes through one corrugation channel to the air electrode of a fuel cell (cathode), and air passing through another corrugation channel cools the anode plate. The anode plate also separates the flows of air and hydrogen, which contacts the hydrogen electrode (anode) on the other side.

The use of lightweight and durable titanium without a protective coating as a core 2 for producing bipolar plates may lead to a significant ohmic loss, since, first, titanium itself is not a good conductor (its electrical conductivity of 0.556 Ohm·mm$^2$/m is worse than that of most other metals), and, second, a non-conductive oxide film is formed on the surface of titanium. The use of thin welded members helps to avoid significant Ohmic loss when current flows perpendicularly to the surface, which loss may be estimated as 3 mV at the current density of 1 A/cm$^2$. Contact surface resistance between such a bipolar member and the fuel cell electrodes may be more substantial. The surface of titanium, e.g., in the form of a foil, is covered by a thick oxide layer that does not enable to use it efficiently as the material of a bipolar plate without special treatment of the titanium surface. Therefore, thin bipolar titanium plates are usually covered with protective coatings that do not allow building up a titanium oxide film and increasing resistance while contacting the fuel cell electrodes. The technical objectives according to the requirements established in respect of bipolar plates of fuel cells with proton exchange membrane (PEM FC) by the US Department of Energy (DOE) (DOE Hydrogen and Fuel Cells Program Record #11014, Mar. 30, 2012) include two main parameters:

1. Corrosion current on the cathode side should be more than 1 μA/cm$^2$ at the potential E=0.6 V (relative to Ag/AgCl), pH 3, 0.1 ppm HF, at 80° ° C. in an aerated solution after holding for 24 hours;
2. Contact surface resistance should be not more than 0.02 Ohm·cm$^2$ at 200 psi (138 N/cm$^2$), measured by the 4-probe method (see: Wang, et al. J. Power Sources, 115 (2003) 243-251).

Magnetron sputtering of protective coatings onto titanium in vacuum is a high-tech method, since it enables to clean the titanium surface (of the core 2) from oxides by ion etching in vacuum and then to apply a protective coating onto the cleaned surface in a single process. While carrying out this disclosure, a welded bipolar member (the core 2) consisting of a titanium anode plate with the thickness of 100 μm and a titanium corrugated sheet with the thickness of 50 μm, as described above, were used for applying a coating. Before applying the protective coating, the surface of the core 2 was degreased in an ultrasonic bath. Then, the welded bipolar member was put into a magnetron sputterer where preliminary ion cleaning of its surface was carried out. Then, the protective nitride-titanium coating (the first layer 3) to the thickness of 0.5-2.0 μm was applied by sputtering a titanium target in the nitrogen atmosphere.

In order to assess properties of the resulting protective coating, the DOE standard, as indicated above, was used. The corrosion current, measured with the use of a Solartron 1287a potentiostat in a three-electrode electrochemical cell at the potential E=0.6 V (relative to Ag/AgCl), pH 3, 0.1 ppm HF, 80° C. in an aerated solution after holding for 24 hours, was $i_{cor}$=4.1 ρA/cm$^2$. The contact resistance, as measured by the 4-probe method with the use of gold-plated electrodes at 138 N/cm$^2$, was $R_{cont}$=0.02 Ohm·cm$^2$.

In order to measure a thickness of the protective coating (the first layer 3) of titanium nitride, which allows achieving the required values of $i_{cor}$ and $R_{cont}$, protective coatings with different sputtering times were prepared. The Table in FIG. 2 shows the influence of the thickness of the protective coating on the properties of the protective. It was also found that the thickness of the protective coating influences a surface resistivity value insignificantly. Further, it was found that the thickness of the protective coating irregularly influences a corrosion current which values did not comply with the requirements of the DOE Standard technical objectives.

Taking the measurements given for Specimens 1-6 (FIG. 2) as the basis, the thickness range for the first layer 3 was selected, which was from 0.2 to 5 μm, more preferably—from 0.5 to 2 μm, that has a contact surface resistance complying with the DOE requirements. At the same time the corrosion current increases manifold at a thickness less than 0.05 μm.

In order to select a required thickness for the second protective coating (the second layer 5), a ceramic coating of cobalt-manganese spinel was applied onto the surface of the first layer 3 of titanium nitride with the thickness of 2.05 μm with the use of a metalorganic complex of 2-ethylhexanoic acid comprising cobalt and manganese in the 1:2 ratio. The application of the liquid metalorganic complex onto the surface of the first layer 3 enabled to fill the pores 4, and, after a thermal treatment at the temperature T=400° C. for 30 minutes, to form a ceramic film of the cobalt-manganese spinel of the corresponding composition with the thickness of 0.03±0.01 μm. The thickness of this ceramic film was determined with the use of a Tescan scanning electron microscope by studying thin sections. The corrosion current, measured with the use of a Solartron 1287a potentiostat in a 3-electrode electrochemical cell at the potential E=0.6 V (relative to Ag/AgCl), pH 3, 0.1 ppm HF, 80° C. in an aerated solution after holding for 24 hours, was $i_{cor}$=0.12 μA/cm². The surface contact resistance, measured by the 4-probe method with the use of gold-plated electrodes at 138 N/cm² at the temperature of 25° C., was $R_{cont}$=19.5 mOhm·cm².

The Table in FIG. 3 shows the influence of thickness of the second layer 5 on the properties of the two protective coatings, i.e., the first layer 3 and the second layer 5. It was found that an increase in the thickness of the second layer 5 leads to an increase in the surface resistivity value, but, at the same time, the corrosion current becomes lower and complies with the requirements of the DOE Standard technical objectives.

Taking the measurements given for Specimens 7-14 (FIG. 3) as the basis, the thickness range for the second layer 5 was selected, which was from 0.01 to 0.10 μm, more preferably—from 0.03 to 0.06 μm. At a thickness close to 0.01 μm and less, the possibility of untight closure of the pores increases, which is manifested in a sharp rise of the corrosion current when the thickness is reduced. At a thickness of more than 0.10 μm, it becomes practically impossible to comply with the DOE requirements to contact resistance, including reduction in the thickness of the first layer.

Thus, the present disclosure ensures high gas-tightness and elasticity of a bipolar plate without compromising its corrosion resistance and contact conductivity.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for forming a bipolar plate of a fuel cell, comprising:
   provision of a core;
   forming, on the core, a first layer having a thickness in the range of 0.2 and 5 μm, said first layer having pores;
   forming, on the first layer, a second layer, wherein the second layer is nonporous and has a thickness in the range of 0.01 to 0.1 μm, said second layer covering at least the pores in the first layer; and
   wherein a combination of the second layer and the first layer yields a contact resistance at 138 N/cm² of less than 0.35 Ohm·cm².

2. The method according to claim 1, wherein the first layer is a nitride titanium layer.

3. The method according to claim 2, wherein the first layer is formed by a magnetron sputtering method.

4. The method according to claim 1, wherein the second layer is a nonporous ceramic film coating produced from one or several metal oxides selected from the group consisting of: oxides of indium, rhenium, lead, bismuth, cobalt-manganese spinel, cobalt-rhenium spinel, titanium perrhenate, lanthanum strontium cobaltite, lanthanum strontium manganite, and lanthanum strontium chromite.

5. The method according to claim 4, wherein the second layer is formed by a method of thermolysis of a metal organic compound.

6. The method according to claim 5, wherein the method of thermolysis comprises application of a metal organic compound onto the first layer surface in air and subsequent heating to a temperature in the range from 300 to 600° C.

7. The method according to claim 1, wherein titanium, or aluminum, or their alloys are used as the core.

8. A bipolar plate of a fuel cell, comprising:
   a core;
   a first layer, on the core, having a thickness in the range of 0.2 and 5 μm, said first layer having pores;
   a second layer, on the first layer, wherein the second layer is nonporous and has a thickness in the range of 0.01 to 0.1 μm, said second layer covering at least the pores in the first layer; and
   wherein a combination of the second layer and the first layer yields a contact resistance at 138 N/cm² of less than 0.35 Ohm·cm².

9. The bipolar plate according to claim 8, wherein the first layer is a titanium nitride layer.

10. The bipolar plate according to claim 8, wherein the second layer is a ceramic coating produced from one or several metal oxides selected from the group consisting of: oxides of indium, rhenium, lead, bismuth, cobalt-manganese spinel, cobalt-rhenium spinel, titanium perrhenate, lanthanum strontium cobaltite, lanthanum strontium manganite, and lanthanum strontium chromite.

11. The bipolar plate according to claim 8, wherein the core is produced from titanium, aluminum, or their alloys.

12. The method according to claim 1, wherein the combination of the second layer and the first layer yields a contact resistance at 138 N/cm² of less than 0.025 Ohm·cm².

13. The method according to claim 1, wherein the thickness of the second layer is in the range of 0.01 to 0.06 μm, and wherein the combination of the second layer and the first layer yields a contact resistance at 138 N/cm² of less than 0.02 Ohm·cm².

14. The method according to claim 1, wherein the bipolar plate is configured as part of a proton exchange membrane fuel cell (PEMFC).

15. The method according to claim 1, wherein the core comprises a titanium anode plate and a titanium corrugated sheet.

16. The method according to claim 15, wherein the core comprises a titanium anode plate with a thickness of about 100 μm and a titanium corrugated sheet with a thickness of about 50 μm.

17. The method according to claim 6, wherein the heating is applied for more than 20 minutes.

18. The method according to claim 17, wherein the heating is applied for about 30 minutes at a temperature of about 400° C.

19. The method according to claim 1, wherein the combination of the second layer and the first layer yields a corrosion current less than about 0.2 μA/cm² at a potential E=0.6 V (relative to Ag/AgCl).

20. The bipolar plate according to claim 8, wherein the combination of the second layer and the first layer yields a contact resistance at 138 N/cm² of less than 0.025 Ohm·cm².

21. The bipolar plate according to claim 8, wherein the thickness of the second layer is in the range of 0.01 to 0.06

μm, and wherein the combination of the second layer and the first layer yields a contact resistance at 138 N/cm² of less than 0.02 Ohm·cm².

22. The bipolar plate according to claim 8, wherein the bipolar plate is configured as part of a proton exchange membrane fuel call (PEMFC).

23. The bipolar plate according to claim 8, wherein the core comprises a titanium anode plate having a thickness of about 100 μm and a titanium corrugated sheet having a thickness of about 50 μm.

24. The bipolar plate according to claim 8, wherein the combination of the second layer and the first layer yields a corrosion current less than about 0.2 μA/cm² at a potential E=0.6 V (relative to Ag/AgCl).

25. A method for forming a bipolar plate of a fuel cell, comprising:
    forming on an electrically conductive core, a first layer having a thickness in the range of 0.2 and 5 μm, said first layer having pores;
    forming, on the first layer, a second layer, wherein the second layer is nonporous and has a thickness in the range of 0.01 to 0.1 μm, said second layer covering at least the pores in the first layer; and
    wherein the combination of the second layer and the first layer yields a corrosion current less than about 0.2 μA/cm² at a potential E=0.6 V (relative to Ag/AgCl).

26. The bipolar plate according to claim 25, wherein the combination of the second layer and the first layer yields a contact resistance at 200 PSI of less than 0.025 Ohm·cm².

27. The bipolar plate according to claim 25, wherein the bipolar plate is configured as part of a proton exchange membrane fuel call (PEMFC).

\* \* \* \* \*